United States Patent [19]

Leipold et al.

[11] Patent Number: 5,160,862

[45] Date of Patent: Nov. 3, 1992

[54] MOSFET SWITCH CIRCUIT FOR PREVENTING THE SWITCH BEING TURNED ON DURING DEACTIVATION OF AN INDUCTIVE LOAD

[75] Inventors: Ludwig Leipold, Munich, Fed. Rep. of Germany; Hubert Rothleitner, Villach, Austria; Rainald Sander; Jenoe Tihanyi, both of Munich, Fed. Rep. of Germany

[73] Assignee: Siemens Aktiengesellschaft, Munich, Fed. Rep. of Germany

[21] Appl. No.: 788,594

[22] Filed: Nov. 6, 1991

[30] Foreign Application Priority Data

Nov. 9, 1990 [EP] European Pat. Off. ......... 90121498.1

[51] Int. Cl.$^5$ .................... H03K 17/687; H03K 17/60
[52] U.S. Cl. .................................. 307/571; 307/570; 307/300; 307/584
[58] Field of Search .............. 307/270, 570, 571, 300, 307/263, 246, 584

[56] References Cited

U.S. PATENT DOCUMENTS

| 4,549,095 | 10/1985 | Stefani et al. | 307/300 |
| 4,808,839 | 2/1989 | Dunn et al. | 307/246 |
| 4,952,827 | 8/1990 | Leipold et al. | 307/300 |
| 5,017,816 | 5/1991 | Wilcox | 307/270 |

FOREIGN PATENT DOCUMENTS

| 0239861 | 3/1987 | European Pat. Off. . |
| 0239862 | 10/1987 | European Pat. Off. . |
| 0336194 | 10/1989 | European Pat. Off. . |
| 0352828 | 1/1990 | European Pat. Off. . |

*Primary Examiner*—Stanley D. Miller
*Assistant Examiner*—Toan Tran
*Attorney, Agent, or Firm*—Hill, Van Santen, Steadman & Simpson

[57] ABSTRACT

In order to rapidly reduce the magnetic energy of an inductive load (2), the driving voltage must be high. When the load (2) is disconnected via a MOSFET (3), then a premature activation of the MOSFET (3) given reversal of the voltage at the inductive load (2) must be prevented. A series circuit of a Zener diode and of a controllable switch (3) is connected between the gate and the load (2). A current source (depletion MOSFET 5) whose current is lower than the current that would flow upon Zener breakdown is connected between the gate and the source of the power MOSFET (1). The MOSFET (3) becomes conductive upon Zener breakdown and the energy is quickly reduced by a high voltage, essentially by the Zener voltage.

3 Claims, 1 Drawing Sheet

MOSFET SWITCH CIRCUIT FOR PREVENTING THE SWITCH BEING TURNED ON DURING DEACTIVATION OF AN INDUCTIVE LOAD

BACKGROUND OF THE INVENTION

The present invention is directed to a circuit arrangement having a power MOSFET and an inductive load that is connected, first, to the source terminal of the MOSFET and, second, to a terminal having a fixed potential, and a series circuit composed of a Zener diode and of a controllable switch connected between the gate terminal of the MOSFET and the terminal.

For example, such a circuit arrangement, has been disclosed by European Patent No. 0 239 861. For an activated inductive load, deactivating of the inductive load is initiated by turning on the controllable switch. The latter discharges the gate-source capacitance of the power MOSFET that thus begins to turn off. The current through the inductive load initially continues to flow and builds up a voltage in non-conducting direction at the Zener diode that can reach the Zener voltage. The driving voltage at the inductive load is therefore the Zener voltage plus the voltage drop across the controllable switch plus the gate-source voltage at the power FET. The driving voltage at the inductive load can therefore be essentially set on the basis of the selection of the Zener voltage. The magnetic energy is then quickly reduced for a high Zener voltage.

When the power MOSFET is operated by an electronic switch, its gate terminal lies at 0 volts in a turned-off condition. When the voltage at the inductive load is reversed, the power MOSFET can begin to switch on when its emitter potential has fallen below zero by the threshold voltage. The driving voltage at the inductive load is therefore limited to a value that corresponds to the threshold voltage of the power MOSFET. The magnetic energy in this case is therefore only slowly reduced.

SUMMARY OF THE INVENTION

It is an object of the present invention to improve a circuit arrangement of the type set forth such that a turn-on of the power MOSFET is reliably prevented as long as the voltage across the Zener diode in a non-conducting direction lies below the Zener voltage.

This object is achieved by a controllable resistor connected between the gate terminal and the source terminal, the value of resistance thereof being controlled such that it has a first, high value given a current flowing upon breakdown of the Zener diode and has a second, lower value below this current.

In further developments of the present invention the controllable resistor can be a current source whose current is lower than the current flowing for Zener breakdown. The current source can be a depletion FET whose saturation current is lower than the current flowing for Zener breakdown. The gate terminal of the depletion FET can be connected to the tap of a voltage divider that is connected in parallel with the inductive load.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
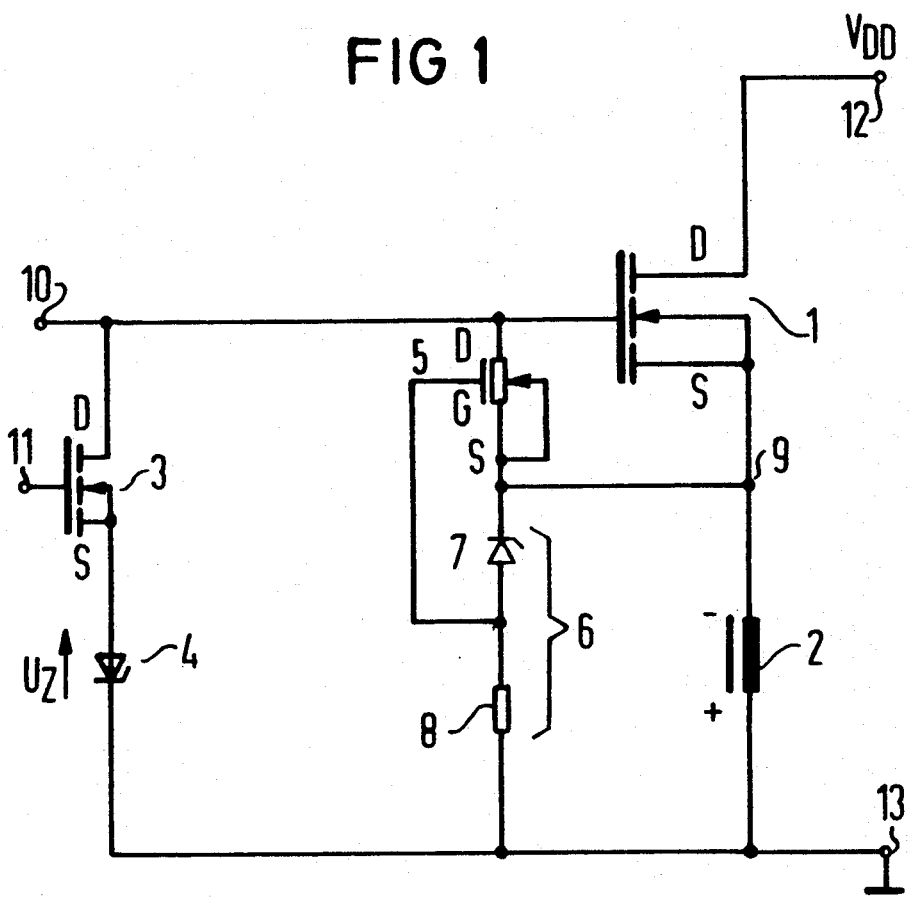
FIG. 1 is a circuit diagram of the present invention.

The circuit arrangement of FIG. 1 contains a power MOSFET 1 to which an inductive load 2 is connected in series at the source side of the MOSFET 1. Via two terminals 12, 13, the series circuit is connected to an operating voltage $V_{DD}$. The terminal 13 lies at a fixed potential, for example at ground. A series circuit composed of a MOSFET 3 and of a Zener diode 4 is connected between the gate terminal of the power MOSFET 1 and the terminal 13. The Zener diode 4 is polarized such that it is loaded in a nonconducting direction by the driving voltage that arises from a deactivating of the inductive load 2. The gate terminal of the power MOSFET 1 is connected to a terminal 10 and the gate terminal of the MOSFET 3 is connected to a terminal 11.

An n-channel depletion MOSFET 5 (also referred to as a deflection FET) is connected between the gate terminal and the source terminal of the power MOSFET 1. The source terminal of the depletion MOSFET 5 is connected to its substrate. Its gate terminal is connected to the tap of a voltage divider 6 that is connected in parallel with the inductive load 2. The voltage divider 6 is composed of a Zener diode 7 and of a resistor 8. The Zener diode 7, however, can also be replaced by a resistor.

For activating the inductive load 2, a positive voltage that is higher than the operating voltage $V_{DD}$ is applied to the terminal 10. For example, it can be supplied by a known pump circuit.

When the inductive load is to be deactivated, then the controllable switch 3 is turned on by a voltage applied to the terminal 11. The gate-source capacitance of the power MOSFET 1 is thus discharged and the power MOSFET begins to turn off. A voltage having the indicated polarity builds up at the inductive load 2. The voltage at the source terminal of the power MOSFET 1 (node 9) thus becomes negative relative to its gate voltage since its gate lies at 0 volts via the terminal 10. The power MOSFET 1 could thus be switched on again.

Figure 2:
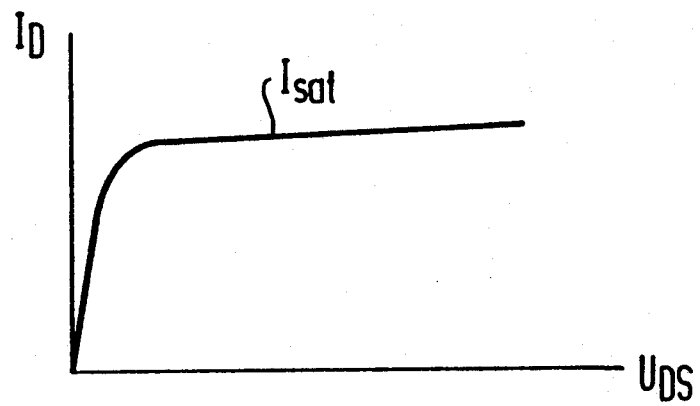
FIG. 2 is a graph depicting the U/I characteristic of a controllable resistor in the FIG. 1 circuit.

This is prevented by the depletion MOSFET 5. This is connected as a current source; its source terminal is connected to the substrate. It is dimensioned such that its saturation current $I_{sat}$ (FIG. 2) is higher than the reverse current that flows through the Zener diode 4 when the Zener diode 4 has not yet broken down. The saturation current, however, is lower than a current that would flow given breakdown of the Zener diode 4.

The voltage across at the inductive load 2 after the activation of the MOSFET 3 and the turn-off of the power MOSFET 1 initially drives a current through the Zener diode 4, the MOSFET 3 and the depletion MOSFET 5 that is lower than the saturation current of the depletion MOSFET 5. Only a slight drain-source voltage drop occurs. The gate terminal and the source terminal of the power MOSFET 1 are thus situated at practically the same potential, so that it remains turned off. When the voltage at the inductive load 2 continues to rise, then the Zener voltage $U_Z$ of the Zener diode 4 is reached and the Zener diode 4 breaks down. The current driven through the Zener diode 4, the MOSFET 3 and the depletion MOSFET 5 thus increases until the saturation current of the depletion MOSFET 5 is reached. The drain-source voltage of the depletion MOSFET thus increases and the power MOSFET 1 is activated when its cut-off voltage is reached. The current of the inductive load 2 can thus flow through the operating voltage source and the power MOSFET 1. The driving voltage is thereby defined by the voltage $U_Z$ plus the drain-source voltage of the controllable switch 3 plus the drain-source voltage of the depletion MOSFET 5. It can be set by an appropriate selection of the Zener diode 4.

In order to reliably turn off the depletion MOSFET 5 when the load 2 is activated, it must have a high resistance when a control voltage is applied at the terminal 10. This is achieved in that its gate terminal is negatively biased in comparison to its source terminal via the voltage divider 6. The depletion MOSFET 5 is thus turned off as long as the voltage at the node 9 is more positive than at the terminal 13.

The MOSFET 3 can be replaced by some other controllable switch, for example by a bipolar transistor. The depletion MOSFET 5 can also be replaced by some other controllable resistor, for example by a bipolar transistor.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A circuit arrangement comprising: a power MOSFET; an inductive load connected between a source terminal of the power MOSFET and a circuit terminal lying at a fixed potential; a series circuit having a Zener diode and a controllable switch, said series circuit being connected between a gate terminal of the power MOSFET and the circuit terminal; a depletion FET connected as a current source between the gate terminal and the source terminal of the power MOSFET, the depletion FET having a saturation current that is lower than a current flowing upon breakdown of the Zener diode and that is higher than reverse current that flows when the Zener diode has not broken down.

2. The circuit arrangement according to claim 1, wherein a gate terminal of the depletion FET is connected to a tap of a voltage divider that is connected in parallel with the inductive load.

3. A circuit arrangement comprising: a power MOSFET; an inductive load connected between a source of terminal of the power MOSFET and a circuit terminal lying at a fixed potential; a series circuit having a Zener diode and a controllable switch, said series circuit being connected between a gate terminal of the power MOSFET and the circuit terminal; a depletion FET connected as a current source between the gate terminal and the source terminal of the power MOSFET; a gate terminal of the depletion FET being connected to a tap of a voltage divider that is connected in parallel with the inductive load and the depletion FET having a saturation current that is lower than current flowing upon breakdown of the Zener diode and that is higher than reverse current that flows when the Zener diode has not broken down.

* * * * *